(12) United States Patent
Mattisson et al.

(10) Patent No.: US 7,102,447 B2
(45) Date of Patent: Sep. 5, 2006

(54) XO-BUFFER ROBUST TO INTERFERENCE (75) Inventors: Sven Mattisson, Bjärred (SE); Hans Hagberg, Malmö (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 150 days.

(21) Appl. No.: 10/837,573

(22) Filed: May 4, 2004

(65) Prior Publication Data

US 2005/0248416 A1 Nov. 10, 2005

(51) Int. Cl.
*H01L 7/00* (2006.01)

(52) U.S. Cl. ............................ 331/16; 331/17; 331/34; 257/275; 257/401; 330/306; 327/156; 327/157

(58) Field of Classification Search ................ 257/275, 257/401; 331/17, 16, 36 E, 34; 330/306; 327/156, 157
See application file for complete search history.

(56) References Cited

U.S. PATENT DOCUMENTS

| | | | | |
|---|---|---|---|---|
| 6,304,091 B1 * | 10/2001 | Shahoian et al. | ........... | 324/662 |
| 6,784,751 B1 * | 8/2004 | Salmi et al. | ................... | 331/16 |
| 2004/0251937 A1 * | 12/2004 | Yang et al. | ................. | 327/156 |

FOREIGN PATENT DOCUMENTS

| | | |
|---|---|---|
| EP | 0 160 484 A | 11/1985 |
| EP | 0 468 207 A | 5/1992 |
| EP | 1 349 268 A | 10/2003 |
| JP | 09 162731 A | 6/1997 |
| JP | 2002 344286 A | 11/2002 |
| WO | WO 01/93418 A | 12/2001 |
| WO | WO 2004/023641 A | 3/2004 |

OTHER PUBLICATIONS

International Search Report for PCT/EP2005/004396 mailed Jul. 13, 2005.
Written Opinion for PCT/EP2005/004396 mailed Jul. 13, 2005.
Möller, M., et al., "15Gbit/s high-gain limiting amplifier fabricated using Si-bipolar production technology," Electronic Letters, Sep. 1, 1994, vol. 30, No. 18, pp. 1519-1521.
Reimann, R., et al., "Bipolar high-gain limiting amplifier IC for optical-fiber receivers operating up to 4 Gbit/s," IEEE Journal of Solid-State Circuits, Aug. 1987, vol. 22, No. 4, pp. 504-511.
Eikenbroek, J., et al., "Frequency Synthesis for Integrated Transceivers," Analog Circuit Design: High-Speed Analog-to-Digital Converters; Mixed-Signal Design; PLL's and Synthesizers, 2000, pp. 339-355.

(Continued)

Primary Examiner—Michael B Shingleton
(74) Attorney, Agent, or Firm—Potomac Patent Group PLLC (57) ABSTRACT Disclosed are methods and circuit configurations for reference frequency signal distribution circuitry that suppress unwanted spurious components introduced by way of RF signal leakage. The methods and circuitry may include relocating components of a buffer along a reference frequency signal path, thereby suppressing conductive and inductive components associated with RF leakage paths entering the circuitry. A filter also may be used after the buffer to suppress spurious components resulting from sub-sampling of unwanted tones in a phase frequency detector or intermodulation between the reference signal and interference tones in the signal-path of the buffer.

19 Claims, 5 Drawing Sheets

OTHER PUBLICATIONS

Lee, T., "The Design of CMOS Radio-Frequency Integrated Circuits," Cambridge University Press, 1998, Only seven pages covering table of contents submitted.

Razavi, B., "RF Microelectronics," Prentice Hall, 1998, Only six pages covering table of contents submitted.

D'Azzo, J. et al., "Linear Control System Analysis and Design," McGraw-Hill Book Company, Second Edition, 1981, Only table of contents submitted.

* cited by examiner

XO-BUFFER ROBUST TO INTERFERENCE

BACKGROUND OF THE INVENTION

1. Field of the Invention

The present invention relates to methods and devices that suppress interference in RF circuitry, and more particularly, to circuits and layout techniques for distributing an oscillator reference signal while suppressing unwanted spurious signals.

2. Description of the Related Art

Integrated radio receivers cannot easily implement radio-frequency (RF) synthesizers that are robust to interference while having a fast settling time. Interference robustness requires that all frequencies be synchronized. This typically requires that the frequency synthesizer reference frequency be equal to the RF channel spacing and that the reference oscillator frequency, generally generated by a crystal oscillator, be an integer multiple of the channel spacing. Such an arrangement would be virtually spurious free, since all frequencies are harmonically related. However, the settling time of a synthesizer having this reference frequency and channel spacing relationship would be undesirably long because settling time is proportional to the reciprocal of the channel spacing (i.e., the reference frequency).

Because of these conflicting requirements, which are further aggravated by the necessity support frequency generation for various standards with unrelated channel spacings, fractional-N synthesizers are commonly used. Fractional-N synthesizers, however, are prone to generating spurious components when the generated radio carrier frequency is close, but not equal to, an integer multiple of the synthesizer reference frequency. Consequently, spurs at offsets equal to the difference between the carrier and the reference harmonic will accompany the carrier. See, Jan-Wim Eikenbroek and Sven Mattisson, "*Frequency Synthesis for Integrated Transceivers,*" chapter Part III, pages 339–355, in *High-Speed Analog-to-Digital Converters: Mixed-Signal Design; PLLs and Synthesizers*, Kluwer Academic Publishers, 2000, the contents of which are incorporated herein by reference. Suppressing these spurious components is very difficult and time consuming, often requiring many applications specific integrated circuit (ASIC) iterations that increase the complexity and cost associated with these devices.

Fractional-N synthesizers typically take the reference frequency from either an on-chip or an off-chip crystal oscillator (XO), which is supplied to the phase frequency detector via one or more buffers. These buffers are needed to guarantee sufficiently low noise levels by boosting the crystal signal power and by making the reference zero crossings as short as possible (e.g., a sharp square wave). Modern radio transceivers (i.e., transmitter plus receiver) often are formed as integrated circuits (e.g., as an ASIC) including one or more RF oscillator(s) on-chip. RF oscillators, however, are sources of undesirable signal and supply leakage that introduce performance-degrading interference, not only into their associated circuits, but also into nearby circuits. One source of interference from an on-chip RF oscillator is the inductor of the oscillator's LC tank circuit, which is tuned to a particular frequency based on an applied control voltage (e.g., by controlling a voltage of varactor that changes the capacitance of the LC tank).

Figure 1:
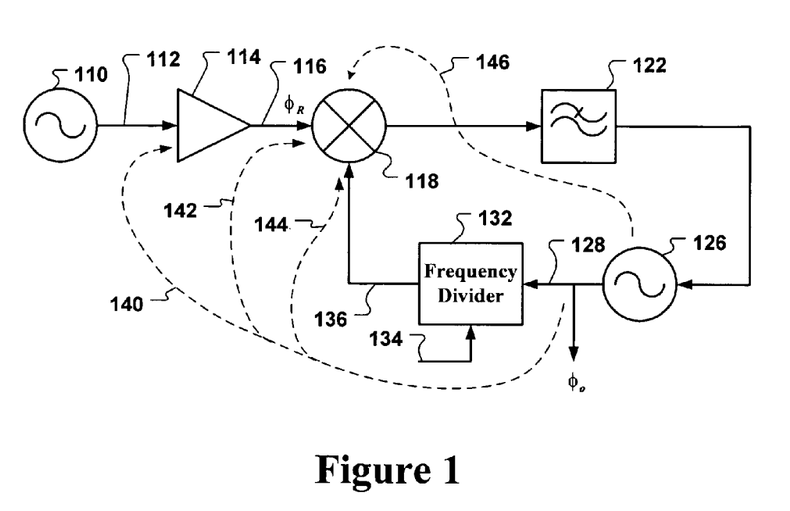
FIG. 1 is a diagram of phase locked loop (PLL) circuit circuitry illustrating VCO-leakage paths.

FIG. 1 depicts interference scenarios that can occur with respect to a conventional fractional-N phase locked loop (PLL) frequency synthesizer. As shown in FIG. 1, a crystal oscillator (XO) 110 generates a reference signal 112, which is fed into a buffer 114. The reference signal is preferably a sinusoidal signal having a frequency denoted by $f_{xo}$ (or more generally, $f_{ref}$, to indicate the frequency of any type of reference frequency signal). The buffer 114 may be a limiter that produces a version of the XO reference frequency signal $\phi_R$ 116 at the frequency $f_{ref}$ and having a steep zero-crossing characteristic. The reference signal output from the XO-buffer is fed to a phase frequency detector (PFD) 118 together with the phase and frequency of the output of the frequency divider 132. The output of the PFD is a pulse that is related to the phase and frequency difference between the reference frequency signal $\phi_R$ 116 and the output of the frequency divider 132. The output from the phase detector 118 is applied to a charge pump (not shown) and then filtered by a loop filter 122. The output of the loop filter 122 is then applied to a voltage-controlled oscillator (VCO) 126. The output signal $\phi_O$ 128 of the VCO 126 is supplied to the input of the frequency divider 132. The frequency divider receives a control signal supplied to the control input 134.

As a result of this feedback arrangement, the frequency, $f_O$, of the VCO 126 output signal $\phi_O$ is driven to equal the frequency of the reference signal times the division factor of the frequency divider 132. Hence, the frequency of the VCO 126 can be controlled by controlling the division factor via the control input 134 of the frequency divider 132.

The frequency divider 132 dynamically divides the frequency $f_O$ of the VCO output signal $\phi_O$ by N and N plus or minus some integer (i.e., N±M, where N and M are integers) in a proportion that results in an average division ratio N plus the fraction, K/F (K and F integers). K/F is the duty cycle that determines the fractional value, where F is the fractional modulus of the circuit (e.g., 8 would indicate a $\frac{1}{8}^{th}$ fractional resolution) and K is the fractional channel of operation. By applying K and F values pertaining to a particular desired frequency to the frequency divider control input 134, the frequency of the signal $\phi_O$ at the VCO 126 output can be set to a frequency of $f_O = f_{ref}(N+K/F)$.

As shown by the dashed paths in FIG. 1, inductive coupling from the VCO inductor will find its way into the crystal oscillator bonding wires (not shown), the reference-frequency signal path 112 along path 140, the PFD input paths 116 and 136 along paths 142 and 144, respectively, and the supply rails (not shown) along path 146. The supplies may also be disturbed by VCO currents, which cause voltage drops between $V_{CC}$, ground, and substrate. When the VCO frequency leaks into either PFD input, undesirable low-frequency mixing products may result.

The PFD inputs of a frequency synthesizer are typically connected to latches. For instance, edge-triggered latches are widely used in the PFD of fractional-N synthesizers. The basic form of this type of PFD includes a pair of edge-triggered, resettable D-flip flops having their D inputs set to logical ONE. The clock inputs of the D-flip flop respectively receive a signal having a frequency of the voltage controlled oscillator (VCO) divided by some number set in a frequency divider. The Q outputs of the D-flip flops are input to an AND gate, which when high, outputs a reset signal to both D-flip flops. The states of the Q outputs from the D-flip flops produce respective "UP" and "DOWN" pulses with a duration corresponding to whether the frequency of the reference frequency leads or lags the frequency of the frequency divided VCO signal. The PFD output is used in a known manner to control a charge pump, which outputs a signal that is low pass filtered and applied to the VCO input. A more detailed description of edge-triggered PFDs can be found in T. H. Lee, "*The Design of CMOS Radio-Frequency Integrated Circuits,*" Cambridge University Press, Cambridge, 1998, and B. Razavi, "*RF Microelectronics,*" Prentice-Hall, Upper Saddle River, 1998, the disclosures of which are incorporated herein by reference.

The latches of an edge-triggered PFD are wideband. When the VCO signal leaks into any of the latch clocks, timing jitter appears in the VCO control voltage generated by the PFD. Jitter on the VCO control voltage will cause mixing of the VCO with the closest harmonic of the reference. When the difference between the two is sufficiently small, two undesirable in-band spurious tones will appear on either side of the VCO output frequency.

Figure 2:
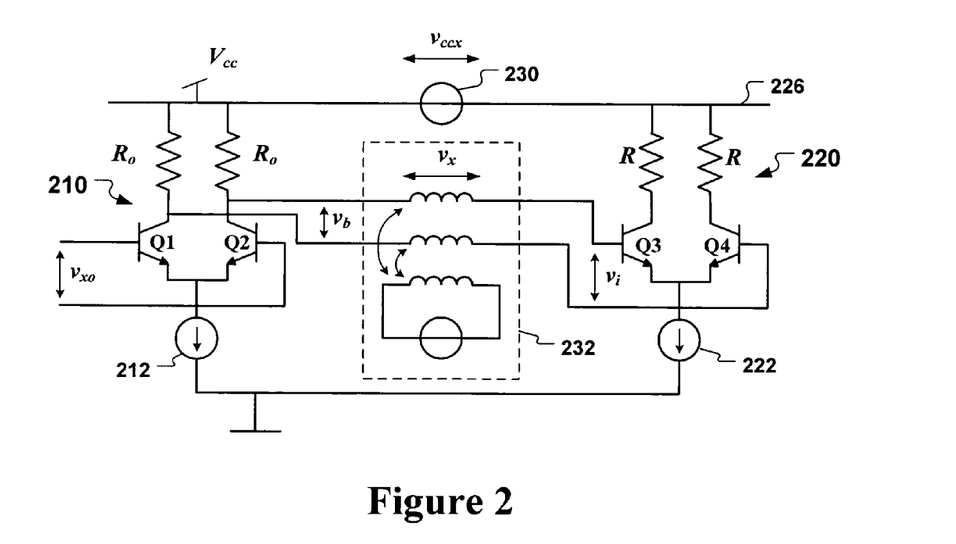
FIG. 2 is a circuit model showing effects of interference due to leakage from an RF component.

Without loss of generality, the interference scenario shown in FIG. 1 can be modeled as shown in FIG. 2. In FIG. 2, the XO-buffer 114 of FIG. 1 is modeled as a differential pair 210 including transistors Q1 and Q2. Each collector of transistors Q1 and Q2 is connected to a load resistor, $R_o$, and the emitters of transistors Q1 and Q2 are commonly connected to a constant current source 212. The input of the phase frequency detector 118 also is shown as a differential pair 220 including transistors Q3 and Q4 having their collector connected to a load resistor R and their emitters commonly connected to a constant current source 222. The load resistors $R_o$ of differential pair 210 and the load resistors R of the phase frequency detector input 220 are connected to the $V_{CC}$ supply voltage rail 226. The input reference frequency signal, $v_{xo}$, from the XO source (in FIG. 1, from XO 110 along path 112) is applied to the buffer input at the bases of transistors Q1 and Q2 of differential pair 210.

Returning to FIG. 1, output signal generated by the XO-buffer is supplied to the input of the phase frequency detector 118 along path 116. Along this path, interference resulting from VCO leakage is modeled in FIG. 2 as two interfering components 230 and 232. This first interfering component 230 is represented by voltage source 230 having voltage $v_{ccx}$ in series with the $V_{CC}$ line between the XO-buffer 210 and the input of the PFD 220. The second interfering component 232 is represented by a three-coil transformer 232 producing inductive interference voltage $v_x$ in series with the path from the XO-buffer output to the PFD input. When these interfering components 230 and 232 are present, the input signal $v_i$ applied to the PFD input 220 will be different from the output signal $v_b$ generated by the XO-buffer.

Problems caused by VCO leakage are presently addressed by employing balanced signal paths in conjunction with circuits having high common-mode and power-supply rejection ratios (CMRR and PSRR, respectively). Balanced layout schemes are effective in some respects because they cause most of the interference into the signal path to be common-mode, and only a small imbalance term, either due to some layout asymmetry or finite CMRR, will interfere with the reference. Such schemes typically suppress interference in the signal path by 20 to 40 dB. Interference entering the supply rails will similarly be suppressed by a high PSRR, typically of the same order as the CMRR. However, with ever-increasing levels of integration, on-chip distances become smaller and smaller. At the same time, because on-chip inductors do not scale with the rest of the circuit technology, the relative spacing of inductors and wires also becomes smaller, further aggravating the inductively coupled interference. For instance, a GSM frequency synthesizer must have output spurious levels more than 44 dB below the carrier at a 400 kHz offset, given a loop-filter attenuation of 23 dB at that offset, which corresponds to reference frequency spuriouses below −88 dBc for the DCS band using a 13 MHz crystal reference. Achieving these spurious frequency levels is becoming increasingly difficult, even with current layout and circuit techniques. Hence, there is a need in the art for a more robust reference frequency distribution scheme.

SUMMARY

It should be emphasized that the terms "comprises" and "comprising," when used in this specification, are taken to specify the presence of stated features, integers, steps or components; but the use of these terms does not preclude the presence or addition of one or more other features, integers, steps, components or groups thereof.

In accordance with one aspect of the invention, a reference frequency distribution apparatus comprises oscillator for generating a reference frequency signal and a buffer device having an input connected to an output signal path of the oscillator. The buffer device includes at least one component spatially located from other components of the buffer to increase the output impedance as seen from the buffer. Rerouting the location of the buffer component causes the output impedance of the buffer to suppress undesirable spurious components generated as a result of RF signal leakage entering into the signal path.

In accordance with another aspect of the invention, a method of suppressing unwanted signals along an RF signal path to an input circuit comprises providing subcomponents of a buffer limiter device in first and second areas of a substrate, and routing an RF signal path from the output of the buffer device to the input circuit provided in the second area of the circuit layout. By providing the buffer limiter subcomponents in the second area, the impedance of the output of the buffer limiter and impedance of the input of the input circuit become mismatched, thereby suppressing interference introduced into the signal path between the buffer limiter output and the input circuit input.

Another aspect of the invention concerns a phase locked loop (PLL) circuit that includes a buffer limiter having an input for receiving a reference frequency signal and an output for outputting a buffered reference frequency signal. A first low-pass filter is connected in a signal path between the buffer and a first input of a phase frequency detector. The output of the phase frequency detector is acted on by a second low-pass filter to produce a filtered phase detector output. A voltage controlled oscillator, in turn, produces an output signal at a frequency dependent on the filtered phase detector output. The output signal is received by a frequency divider, which produces a divided frequency signal. In the PLL, the physical placement of components of the first filter and the buffer cause the output impedance of the buffer to be greater than the impedance of the first input of the phase frequency detector.

Additional aspects and advantages of the invention will be set forth in the description that follows, and in part will be apparent from the description, or may be learned from practice of the invention. The aspects and advantages of the invention will be realized and attained by the system and method particularly pointed out in the written description and claims hereof as well as in the appended drawings.

It is to be understood that both the foregoing general description and the following detailed description are exemplary and exemplary only and are not restrictive of the invention, as claimed.

BRIEF DESCRIPTION OF THE DRAWINGS

The accompanying drawings, which are included to provide a further understanding of the invention and are incorporated in and constitute a part of this specification, illustrate exemplary embodiments of the invention that together with the description serve to explain the principles of the invention. In the drawings.

DETAILED DESCRIPTION

These and other aspects of the invention will now be described in greater detail in connection with exemplary examples that are illustrated in the accompanying drawings.

To arrive at a solution to the interference pickup problems described above, the simplified model shown in FIG. 3 is used to analyze the interference sources depicted in FIG. 2. For the sake of generality, all signals are assumed to be unbalanced, but the result derived is easily extended to the balanced case (i.e., symmetric or almost symmetric) by applying the correct amount of cancellation due to PSRR and CMRR. Thus, in the following, only an unbalanced signal notation is used.

Figure 3:
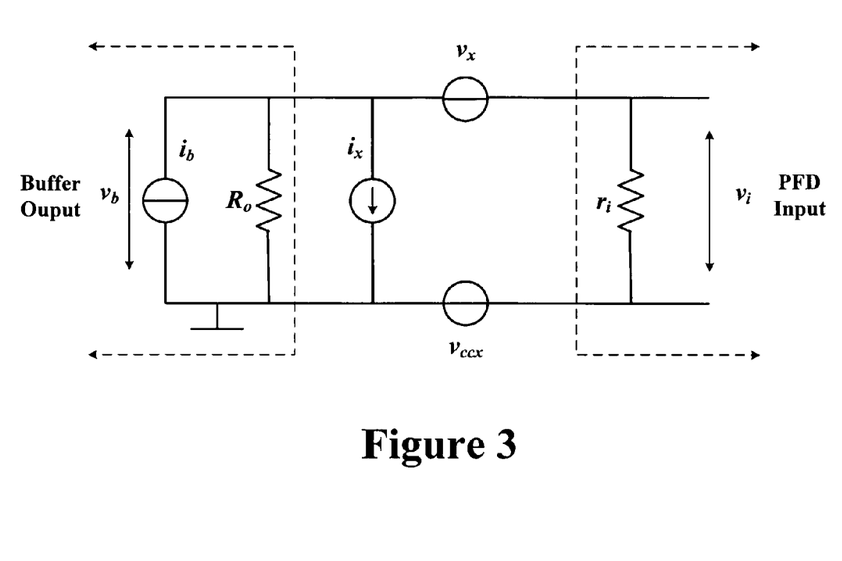
FIG. 3 is circuit model illustrating interference components of FIGS. 1 and 2 as circuit elements.

As shown in FIG. 3, $i_b$ and $v_b$ represent the current and voltage output of the buffer, respectively, and $v_i$ represents the phase-frequency detector (PFD) input voltage. The inductive signal interference is modeled in FIG. 3 by the voltage source, $v_x$, and capacitive (conductive) signal cross talk is represented by the current source $i_x$. The supply interference is represented by the voltage source $v_{ccx}$, and the buffer output impedance and the PFD input impedance is represented by $R_o$ and $r_i$, respectively. It can be shown that $$v_i = \frac{r_i}{r_i + R_o}[(i_b + i_x) \cdot R_o + (v_x + v_{ccx})], \quad (1)$$

where frequency dependencies have been left out for simplicity. Normally a buffer is designed to have low output impedance (i.e. $R_o \ll r_i$) so equation (1) may be simplified as follows:

$$v_{i1} \approx [(i_b + i_x) \cdot R_o + (v_x + v_{ccx})]. \quad (2)$$

This strategy reveals that effects of capacitive cross talk can be minimized by choosing $i_b$ such that $i_x$ becomes insignificant. Additionally, it should be apparent that large separations of the circuit components could cause $v_x$ and $v_{ccx}$ to be much smaller than $i_b \cdot R_o$. However, present and future requirements for increased circuit density make such sepa-rations increasingly difficult, if not impossible to achieve. Hence, another way of suppressing $v_x$ and $v_{ccx}$ must be provided.

The invention addresses interference resulting from RC leakage in a first exemplary way by changing the impedance levels on the buffer output and the PFD input. For instance, letting $R_o \gg r_i$, results in:

$$v_{i_2} \approx \left[i_b \cdot r_i + \frac{r_i}{R_o}(v_x + v_{ccx})\right] \quad (3)$$

where $i_x$ has been neglected because it will not contribute more than in equation (2). From equation (3), it can be seen that the interference due to $v_x$ and $v_{ccx}$ will be suppressed by the ratio $R_o/r_i$. It can be seen that the buffer can be made robust to interference due to $v_x$ and $v_{ccx}$ by creating an impedance mismatch via a high buffer output impedance.

Figure 4:
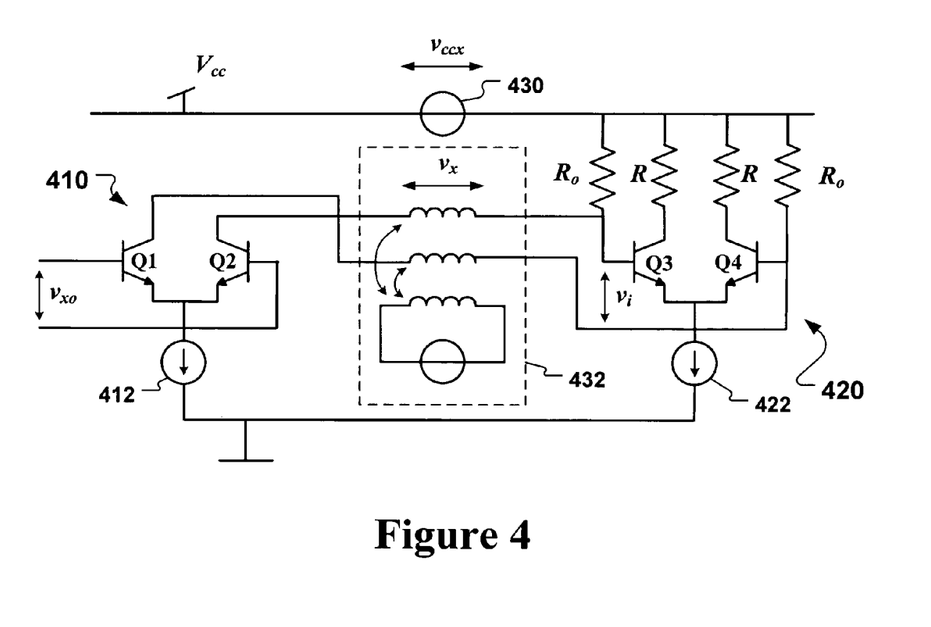
FIG. 4 shows part of PLL circuitry in which load resistors have been relocated in accordance with an exemplary example of the present invention.

FIG. 4 shows an exemplary way to increase the buffer output impedance relative to the phase-detector input impedance to achieve a high ratio $R_o/r_i$. As shown in FIG. 4, the buffer load resistors $R_o$ are provided physically closer to the inputs of the phase-detector input 420 instead of being provided with the buffer cell 410. Providing the buffer load resistors $R_o$ closer to the PFD inputs increases the buffer output resistance and decreases the input resistance of the PFD, thus suppressing interference due to $v_x$ and $v_{ccx}$ as can be seen from equation (3).

For example, RF ASICs typically have a $R_o$ value of approximately 500 mv/1 mA or 500 Ω. The corresponding typical input resistance $r_i \approx \beta/g_m$, or about 2.5 kΩ at 1 mA. (The buffer and phase-detector input will typically operate at similar current levels for noise reasons.) When the resistors are moved to the PFD input side, the input resistance of the PFD becomes $r_i \approx R_o$, or 500 Ω and the buffer output impedance, denoted here as $r_o$, is given by the Early-voltage, $V_A$, of the transistors Q3 and Q4. A typical Early-voltage $V_A$ may be 25 V at a collector current ($I_C$) of 1 mA. This translates to a buffer output resistance $r_o \approx V_A/I_C$, or 25 kΩ, yeilding an extra $v_x$ and $v_{ccx}$ interference suppression of 25000/500, or 40 dB.

In the case where interference is already present in the signal path from the reference signal source, simply relocating the load resistors $R_o$ would not be sufficient to suppress spurious components arising from the interference. For instance, interference on the reference signal path may cause a PLL spurious tone in two ways: (1) by subsampling (i.e., folding) of unwanted tones in the PFD or (2) by intermodulation between the reference signal and interference tones in the signal-path of the buffer(s) (before the PFD inputs). Hence, an alternative or additional way would be required to suppress spurious components caused by subsampling and intermodulation.

In accordance with the invention, suppression of these tones is accomplished in a second way in which the reference frequency signal is cleaned by filtering. In the following analysis, it is assumed that interference is caused by interference tones. However, the concepts discussed below are also valid for noise as well when bearing in mind that increased noise floor or noise "humps" will be observed instead of distinct PLL spurs associated with interference tones.

The phase noise caused by the subsampling of the RF at the PFD input is approximately proportional to the ratio of the reference and interference signal slew rates (when the interference is much smaller than the reference) at the PFD input. To reduce phase noise, it is known to place a limiting buffer early in the reference path to maximize the reference signal slew rate while limiting any impact of interference picked up after the buffer. However, once interference has entered the signal path, simply adding limiters will not change the slew-rate ratio. In this case, a low-pass filter may be introduced to suppress the interferer while minimizing the impact on the reference signal.

Figure 5:
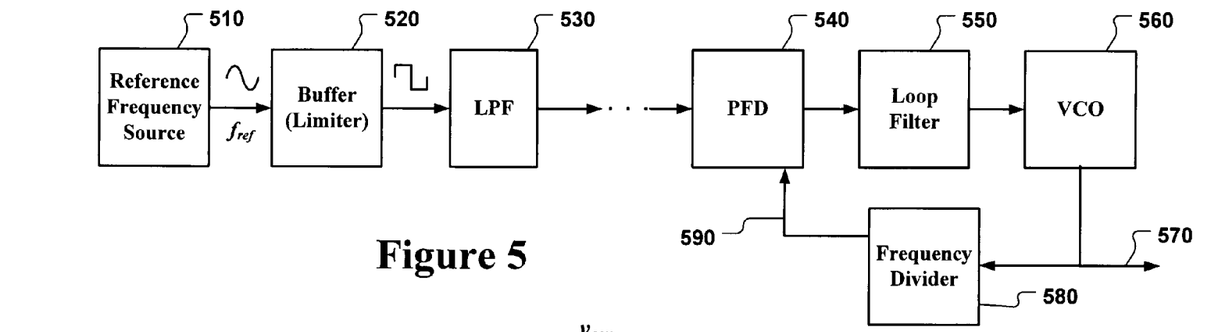
FIG. 5 is a block diagram of exemplary PLL RF circuitry that includes a filter provided before the phase frequency detector in accordance with an exemplary example of the present invention.

FIG. 5 is a block diagram of a fractional-N phase locked loop circuit in which a low-pass filter is used to suppress spurious tones caused by interference in the signal path of the reference frequency signal in accordance with an exemplary example of the invention. The PLL depicted may be used, for example, in transmit circuitry of a communications device such as a mobile phone. Similar circuitry may be used in the receive circuitry of such a device, for example.

An input reference signal having a frequency $f_{ref}$ is supplied to an input of a buffer 520, which limits the amplitude and outputs a square wave signal having steep zero crossings. The output from the buffer is supplied to a low-pass filter (LPF) 530, which filters the reference signal and supplies the filtered signal to a first input of a phase frequency detector (PFD) 540. While only one buffer 520 is shown in FIG. 5, it is to be understood that a number of buffer stages and LPFs may be present in the path between the low pass filter 530 and the PFD 540. The output from the PFD 540 is filtered in a loop filter 550 and passed to a voltage controlled oscillator (VCO) 560, which supplies an output signal at the VCO output 570. The output from the VCO 560 also is supplied to a frequency divider 580, where it is divided by a division ratio. The divided output from the frequency divider 580 is supplied along path 590 to a second input of the PFD 540.

After the first buffer (i.e., a limiter) 520, the output will approach a square wave in shape. Thus, the impact of a low-pass filter 530 on the signal zero-crossing slew rate can be estimated by evaluating the filter output peak slew rate when subject to a step input. The maximum slew rate will be a reasonable approximation of the slew rate in the zero crossing.

A filter output response can be calculated in the Laplace domain as follows:

$$v_o(s) = v_i(s) \cdot H(s),$$

where $v_i(s)$ and $H(s)$ is the filter input signal and transfer function, in the s plane, respectively. The normalized output slew rate due to a step input (i.e., $v_i(s)=1/s$) will then be $$\dot{v}_o(s) = s \cdot v(s) \cdot H(s) = H(s).$$

Assuming an on-chip passive filter, all poles will be real and it may be assumed, for the sake of simplicity without loss of generality, that all poles coincide. The transfer function of such an n-pole filter may then be depicted as:

$$H(s) = \frac{H_0 \cdot a^n}{(s+a)^n},$$

where a is the filter pole angular frequency and $H_0$ the low-frequency gain. (See, e.g., John J. Dt'Azzo and Constantine H. Houpis, *Linear Control System Analysis and Design—conventional and modern*, McGraw-Hill, 1981.) The normalized (i.e., a=1 and $H_0$=1) time derivative of the output voltage will then be equal to the filter impulse response, as the derivative operator and the input signal cancel out, or $$h(t) = \mathcal{L}^{-1}(H(s)) = e^{-t} \frac{t^{n-1}}{(n-1)!}.$$

The peak slew rate is approximately equal to the zero-crossing slew rate and may be approximated by $$\|\dot{v}_o\| \approx 1/n$$

with less than 35% error for $n \leq 10$.

The normalized filter slew rate is proportional to the reciprocal of the filter order. Thus, the denormalized slew rate will be proportional to the filter pole frequency divided by its order (i.e., a/n). Further, the filter high-frequency attenuation is proportional to $(s/a)^n = (\omega_{RF}/a)^n$. To maximize the slew-rate-attenuation product we should maximize n while minimizing a, as the attenuation grows faster with n than the slew rate decays. However, due to noise constraints, the slew rate may not be degraded and one is often forced to choose a much higher filter pole frequency than what would result in a maximum slew-rate-attenuation product. A typical choice of pole frequency (i.e., $a/2/\pi$) would be the crystal oscillator reference frequency, $f_{ox}$, often 13 or 26 MHz, times the product of preceding limiter zero-crossing gains, typically $10^m$, where m is the number of limiters. In practice, when m exceeds, for example, 3, the limiters, not the filter, will limit the bandwidth. In this case the filter could probably be skipped as the attenuation will be very small (i.e., $\omega_{RF} \sim a$) or the filter bandwidth could be set to be similar to the limiter bandwidth. However, as will be shown below, filters are preferably placed after the first limiter, in which case m=1.

Figure 6A:
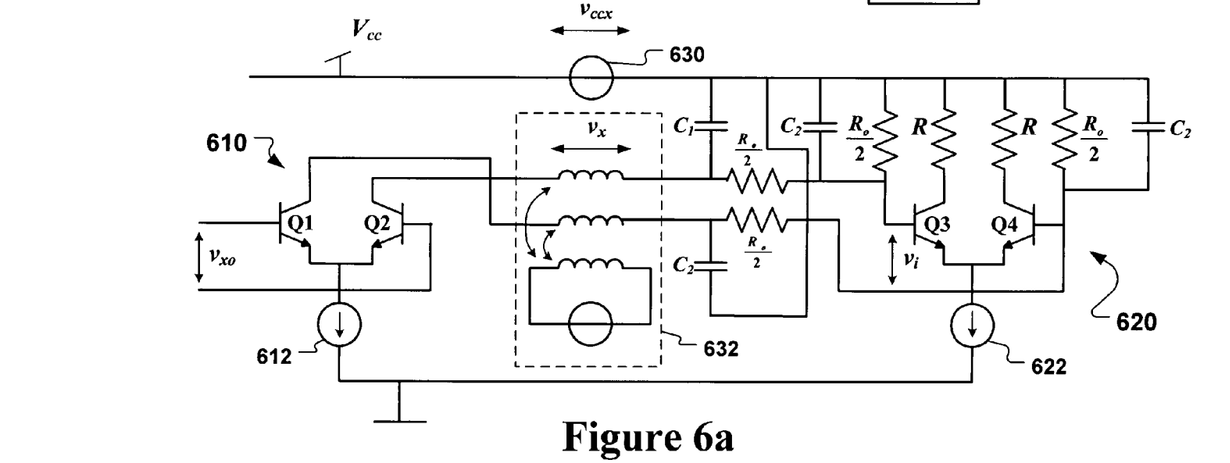
FIGS. 6a to 6c each are diagrams showing components of PLL circuitry in which a low-pass filter is provided before a phase frequency detector in accordance with exemplary examples of the present invention.
Figure 6B:
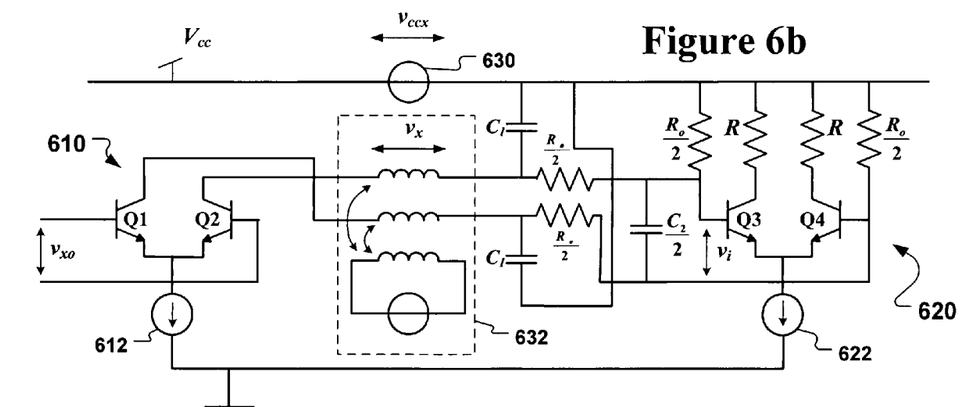
Figure 6C:
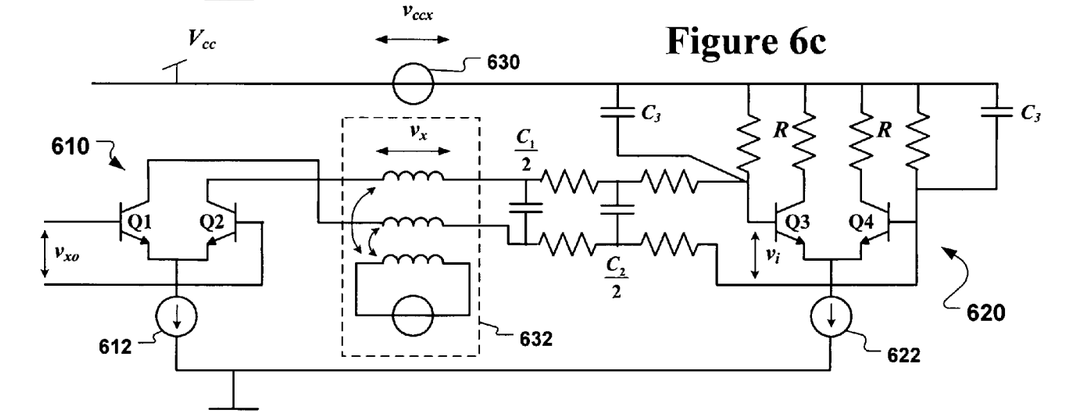

FIGS. 6a to 6c show exemplary implementations of a low-pass filter between a buffered reference frequency signal and a phase frequency detector input. It should be appreciated that the depicted circuits may be part of a PLL, for example, a PLL of a frequency synthesizer, of a modulator, or some other RF circuitry. Circuit parts shown in FIGS. 6a to 6c are described above with respect to elements similarly labeled in FIG. 4. For instance, the function of current sources 612/622, transistors Q1 to Q4, and the modeled conductive and inductive interference 630/632 of FIGS. 6a to 6c respectively correspond to the description, above, of current sources 412/422, transistors Q1 to Q4, and modeled conductive and inductive interference 430/432 of FIG. 4.

FIG. 6a shows a buffer 610 and PFD input 620 of a PLL in which a two-pole low-pass filter has been added in the signal path before the PFD input. The two-pole low-pass filter of FIG. 6a is a single-ended configuration including two capacitors having a value $C_1$, two capacitors having value $C_2$, and resistors (shown valued at $R_o/2$) connected to signal ground. Other filter topologies could be used, such as active-RC or LRC filters, but should preferably be of at least second order, have low input impedance, and placed close to the PFD input. A low-pass filter so arranged increases the inter-stage impedance mismatch, thus lowering the inductive interference pickup, in addition to the suppressing high-frequency interference and noise.

It is possible to save some chip area, at the cost of CMRR, by providing one or more pairs of capacitors and resistors in a differential configuration (e.g., by connecting these components across signal lines). For example, FIG. 6*b* shows an example of the invention in which a filtered buffer path has two-poles, one single-ended and one differential. FIG. 6*c* shows an exemplary filtered buffer path having 3 filter poles, two of which are differential and one single ended.

A limiting buffer has a saturating transfer function. This transfer function is strongly nonlinear and stabilizes the output signal amplitude (and thus, also the PLL loop gain), while enhancing the zero-crossing slew rate. When a sinusoidal signal from an oscillator, for example, a crystal oscillator (XO) producing a signal having an angular frequency $\omega_{xo}$, and a small RF interferer are passed through such a limiter both signal components are subject to harmonic and intermodulation tone generation. The dominating components are fast decaying a square wave-like spectrum of the harmonics of crystal oscillator signal and odd-order intermodulation products around the RF tone. These two signal components can be expressed as:

$$v_{xo} = v_{xo1} \sum_i c_i \cdot \sin(i \cdot \omega_{xo} \cdot t), i = 1, 3, 5, \ldots, \quad (4)$$

where $v_{xo1}$ is the amplitude of the fundamental tone with $c_i \leq 1/i$, and:

$$v_{rf} = v_{rf0} \sum_i c_i \cdot \sin[(\omega_{rf} + i \cdot \omega_{xo}) \cdot t], \quad (5)$$
$$i = \ldots -5, -3, -1, 0, 1, 3, 5, \ldots,$$

where $v_{rf0}$ is the amplitude of the fundamental RF interference tone, respectively.

After one limiter stage the RF intermodulation products fall off fast enough not to cause any low-frequency spurious components close to the reference signal fundamental tone. However, after a second limiter stage (i.e. when the signals have passed through a cascade of two limiters) the situation is very different. In this case, the amplitudes of the intermodulation tones around the RF interferer do not fall off appreciably with the distance from the RF fundamental, as was the case with only one successively connected limiter. The effect of this spectrum widening is that now intermodulation tones are present very close to the crystal oscillator fundamental frequency, $f_{xo} = (\omega_{xo}/2\pi)$, when the RF carrier is chosen to be an odd multiple of the oscillator frequency $f_{xo}$ (e.g., $71 \cdot f_{xo} + \Delta_f$). When an RF carrier is close to an even multiple of $f_{xo}$ (e.g., $72 \cdot f_{xo} + \Delta_f$), a similar spectrum results, but with the odd-order intermodulation tones between crystal oscillator harmonics. In either case, it will be very difficult to remove the intermodulation tones by filtering because filters having very high Q values would be needed. Such filters would probably be complex active filters or RLC filters, both variants prone to pick up interference due to large area and/or mutual inductances to RF-carrying wires.

The mechanism behind the intermodulation spectrum widening is that after the first limiter, the limiter is no longer fed with two sinusoidal signals. The second limiter will see the sum of two signals described in equations 4 and 5 as input. Now, not only are odd-order intermodulation components from the two fundamentals present, but all combinations of the fundamentals plus hatmonics and side bands, resulting in the rather flat intermodulation spectrum around the RF fundamental. The only way to filter out higher-order inter-modulation products would be to suppress the RF components between the first and second limiter. When there is several entry points for RF interference, filters should be provided between limiters following these entry points.

Figure 7:
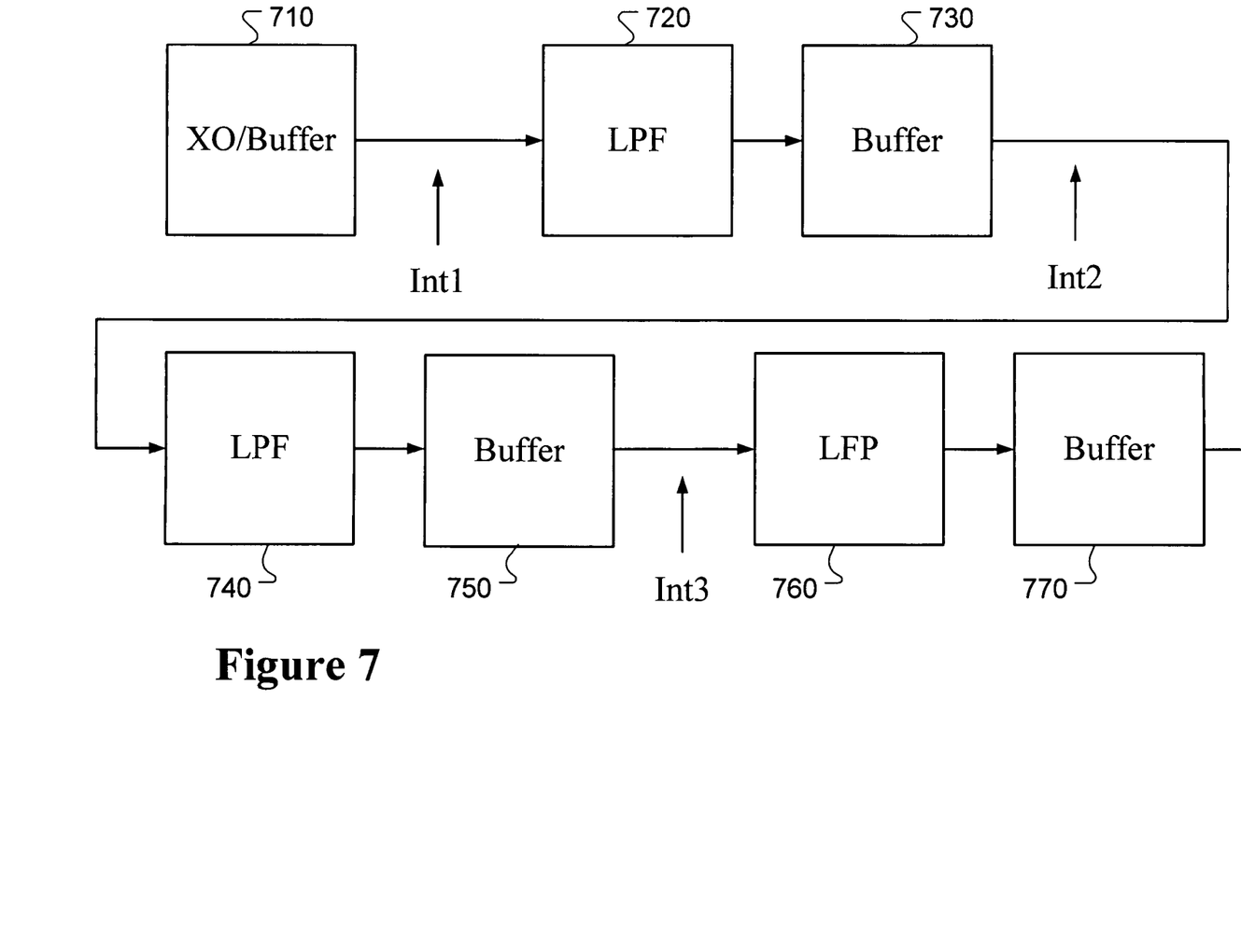
FIG. 7 is a block diagram showing a cascaded arrangement of low-pass filter and buffer circuits along a path of a reference frequency signal.

FIG. 7 is a block diagram of a signal path including cascaded low-pass filters and buffers in accordance with the invention. The signal path starts at the XO and buffer frequency signal distribution apparatus 710. While apparatus 710 is shown as having an XO reference frequency signal source, the concept of cascading extends to RF type oscillator circuits in general or other signal sources susceptible to interference from RF leakage. Apparatus 710 outputs a signal having a reference frequency $f_{xo}$, which is provided to an input of the low-pass filter 720. Along this path is an entry point for RF interference Int1. The low-pass filter 720 increases interstage impedance mismatch and filters out the higher-order inter-modulation components introduced by the interference Int1. The filtered output of the filter 720 is supplied to the input of the buffer limiter 730. If no interference problems are present in the signal path after buffer 730, additional buffers may be provided in series with the buffer 730.

FIG. 7 illustrates a case where additional interference Int2 is introduced after the output of the buffer 730. Similar to the low-pass filter 720 and buffer 730, the low-pass filter cleans the signal and increases impedance mismatch to the next stage. This may be repeated, if necessary for any number of interference points along the signal path. For instance, FIG. 7 shows interference Int3 entering into the signal path after buffer 750, and an additional cascaded low-pass filter 740 and buffer 750 succeeding this point of entry. As can be seen, practically any number of buffer and filter combinations may be used to suppress interference and minimize its impact on the signal.

The foregoing derivation has largely neglected frequency dependent effects in the derivations, but these could easily be inferred by those skilled in the art. The invention has been described with reference to particular examples. However, it will be readily apparent to those skilled in the art that it is possible to embody the invention in specific forms other than those of the preferred embodiment described above. This may be done without departing from the spirit of the invention.

For example, while the foregoing examples describe bipolar-based circuits, the same principles could be applied to other technologies, for example CMOS. While the above-described examples concern paths within a crystal oscillator signal path of a PLL, the use of these techniques is not limited to this path and could be applied to other sensitive paths as well. In particular the PFD feedback path shares the same sensitivity as its input. For example, with reference to FIG. 5, the invention can be used to suppress spurious components entering along path 590. Depending on layout distances, the presented principle could be applied to this signal path as well. Additionally, the present invention is not limited to use in PLL circuits, but can be used in other RF circuits requiring a reference frequency signal. For example, the invention can be used to suppress spurious components in mixer circuits, waveform generators, and in other circuits requiring a suppression of undesirable spurious components.

By rerouting some of the buffer components a substantial suppression of inductive and supply induced interference components can be achieved. A suppression ratio of approximately 40 dB can be expected without impacting the normal operation of the buffer chain. By also adding filtering, further suppression can be achieved and/or the generation of intermodulation products be prevented. The cost in chip real estate is essentially zero when not employing filters, and should be very small when filters are used. The extra interference margin will reduce the spurious levels significantly, possibly saving one or more ASIC re-spins. The invention is applicable to both balanced and single-ended signals.

It will be apparent to those skilled in the art that various changes and modifications can be made in the reference frequency distribution methods and configurations of the present invention without departing from the spirit and scope thereof. Thus, it is intended that the present invention cover the modifications of this invention provided they come within the scope of the appended claims and their equivalents.

What is claimed is:

1. A method of suppressing unwanted signals along an RF signal path to an input circuit, comprising:
   providing subcomponents of a buffer in first and second areas of a circuit layout; and
   routing an RF signal path from the output of the buffer to the input circuit provided in the second area of the circuit layout, wherein said provision of the buffer subcomponents in the second area causes impedance of the output of the buffer and impedance of the input of the input circuit to be mismatched and thereby suppress interference introduced into the signal path between the buffer output and the input circuit input.

2. The method of claim 1, comprising providing a low-pass filter along the RF signal path in close proximity to the input circuit.

3. The method of claim 1, further comprising providing more than one low-pass filter and more than one buffer in the signal path between the output of the buffer and the input of the input circuit, wherein no two of said buffers are consecutively connected along said signal path.

4. A phase locked loop circuit, comprising:
   a buffer having an input for receiving a reference frequency signal and an output for outputting a buffered reference frequency signal;
   a phase frequency detector having first and second inputs;
   a first low-pass filter connected in a signal path between the buffer and the first input of the phase frequency detector;
   a second low-pass filter, acting on the phase detector output to produce a filtered phase detector output;
   a voltage controlled oscillator, for producing an output signal at a frequency dependent on the filtered phase detector output;
   a frequency divider, for receiving the output signal and producing a divided frequency signal; wherein physical placement of components of the first filter and the buffer cause the output impedance of the buffer to be greater than the impedance of the first input of the phase frequency detector.

5. The phase locked loop of claim 4, wherein said physical placement suppressing interference present on the signal path between the buffer output and the first input of the phase frequency detector.

6. The phase locked loop of claim 4, wherein the buffer further comprises a differential output connected to the first input of the phase frequency detector.

7. The phase locked loop of claim 6, wherein at least one component of the first low-pass filter is connected across the differential output.

8. The phase locked loop of claim 5, wherein at least one component of the first low-pass filter is connected to ground.

9. The phase locked loop of claim 4, comprising a second buffer connected to an output of the second low-pass filter.

10. The phase locked loop of claim 5, wherein the first low-pass filter comprises at least two poles.

11. The phase locked loop of claim 10, wherein the first low-pass filter comprises more than two poles.

12. The phase locked loop of claim 4, wherein the phase frequency divider is a fractional-N frequency divider.

13. The phase locked loop of claim 4, wherein the oscillator component comprises a crystal-oscillator.

14. The phase locked loop of claim 4, further comprising a signal path from the output of the phase frequency detector to the second input of the phase frequency detector, said signal path including a second buffer and a third low-pass filter.

15. The phase locked loop of claim 14, further comprising at least two said buffers in the signal path from the output of the phase frequency detector to the second input of the phase frequency detector, wherein said third low-pass filter connected in the signal path between two of the buffers.

16. The phase locked loop of claim 14, wherein the output impedance of the second buffer is greater than the input impedance of the second input of the phase frequency detector.

17. The phase locked loop of claim 4, wherein resistive components of the buffer are provided in an area in which is provided an input circuit of the phase frequency detector that receives the buffered reference signal, and wherein said area is spaced from components of the buffer other than the resistive components such that said output impedance is attained.

18. The method of claim 1, wherein said buffer is a limiter.

19. The phase locked loop of claim 4, wherein said buffer is a limiter.

* * * * *

UNITED STATES PATENT AND TRADEMARK OFFICE
CERTIFICATE OF CORRECTION

PATENT NO. : 7,102,447 B2 Page 1 of 1
APPLICATION NO. : 10/837573
DATED : September 5, 2006
INVENTOR(S) : Sven Mattisson and Hans Hagberg It is certified that error appears in the above-identified patent and that said Letters Patent is hereby corrected as shown below:

Column 6, Line 40: Change "yeilding" to --yielding--

Column 7, Line 48: Change "$v_o(s)=s \cdot v(s) \cdot H(s)=H(s)$." to -- $v_o(s)=s \cdot v_i(s) \cdot H(s)=H(s)$.--

Column 9, Lines 25-26: Change "$c_i \leq 1/i$," to --$c_i \lesssim 1/i$,--

Column 9, Line 66: Change "hatmonics" to --harmonics--

Signed and Sealed this

Fourth Day of September, 2007

JON W. DUDAS
*Director of the United States Patent and Trademark Office*

UNITED STATES PATENT AND TRADEMARK OFFICE
CERTIFICATE OF CORRECTION

PATENT NO.         : 7,102,447 B2
APPLICATION NO.    : 10/837573
DATED              : September 5, 2006
INVENTOR(S)        : Sven Mattisson and Hans Hagberg It is certified that error appears in the above-identified patent and that said Letters Patent is hereby corrected as shown below:

Column 6, Line 40: Change "yeilding" to --yielding--

Column 7, Line 48: Change "$v_o(s)=s \cdot v(s) \cdot H(s)=H(s)$." to -- $v_o(s)=s \cdot v_i(s) \cdot H(s)=H(s)$.--

Column 9, Lines 25-26: Change "$c_i \leq 1/i$," to --$c_i \lesssim 1/i$,--

Column 9, Line 66: Change "hatmonics" to --harmonics--

Signed and Sealed this

Twenty-fifth Day of September, 2007

JON W. DUDAS
*Director of the United States Patent and Trademark Office*